United States Patent [19]

Sugiyama

[11] Patent Number: 4,930,108

[45] Date of Patent: May 29, 1990

[54] SEMICONDUCTOR MEMORY DEVICE WITH SERIAL ACCESS MEMORY

[75] Inventor: Tsutomu Sugiyama, Kasugai, Japan

[73] Assignees: Fujitsu Limited, Kanagawa; Fujitsu VLSI Limited, Aichi, both of Japan

[21] Appl. No.: 278,502

[22] Filed: Dec. 1, 1988

[30] Foreign Application Priority Data

Dec. 4, 1987 [JP] Japan .................... 62-307936

[51] Int. Cl.⁵ .................................. G11C 7/00
[52] U.S. Cl. ....................... 365/230.02; 365/239; 365/230.09
[58] Field of Search ............ 365/230.02, 230.04, 365/230.09, 239, 240, 233, 230.05, 189.02

[56] References Cited

U.S. PATENT DOCUMENTS

| | | | |
|---|---|---|---|
| 4,633,441 | 12/1986 | Ishimoto | 365/240 X |
| 4,733,376 | 3/1988 | Ogawa | 365/240 X |
| 4,757,477 | 7/1988 | Nagayama et al. | 365/230.05 |

Primary Examiner—Joseph A. Popek
Attorney, Agent, or Firm—Armstrong, Nikaido, Marmelstein, Kubovcik & Murray

[57] ABSTRACT

A semiconductor memory device includes: a first memory cell array having a plurality of memory cells arrayed in a row direction and a column direction; a second memory cell array having at least serial access memory cells corresponding to a single row of the first memory cell array; a first data bus; a second data bus; a third data bus; and a bus switching control circuit for controlling a connection of each of the serial access memory cells to one of the first, second and third data buses and selecting one of the buses to connect the selected data bus to the external of the device. The bus switching control circuit outputs each of bit data in the serial access memory cells serially and alternately to the first and second data buses and, where a plurality of transfer data blocks are serially read out from the second memory cell array, outputs a bit data in the serial access memory cell corresponding to the head or last address in each of the transfer data blocks to the third data bus. As a result, it is possible to prevent interruption from being generated between the transfer data blocks in the serial data transfer operation and thus to increase the data transfer speed.

15 Claims, 16 Drawing Sheets

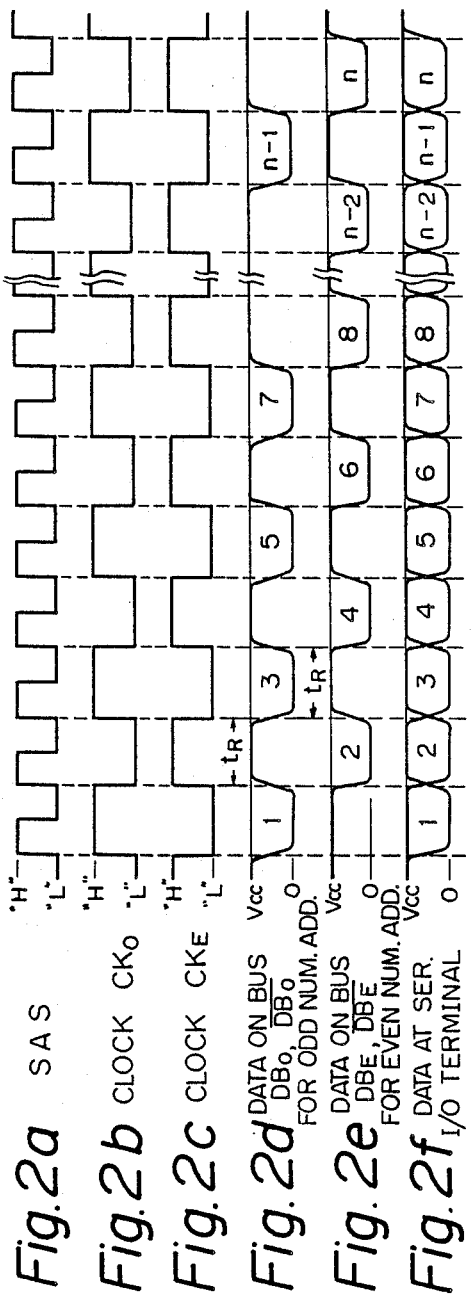

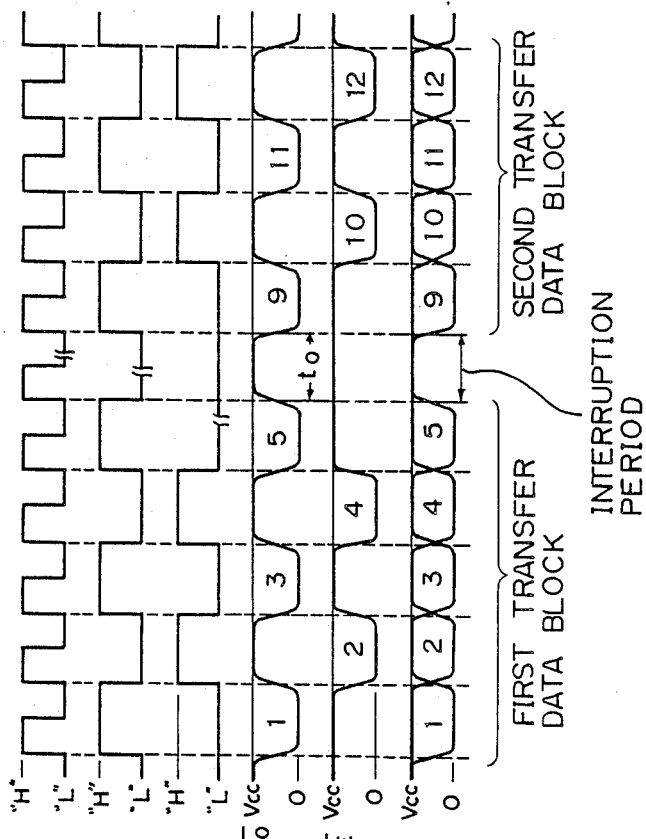

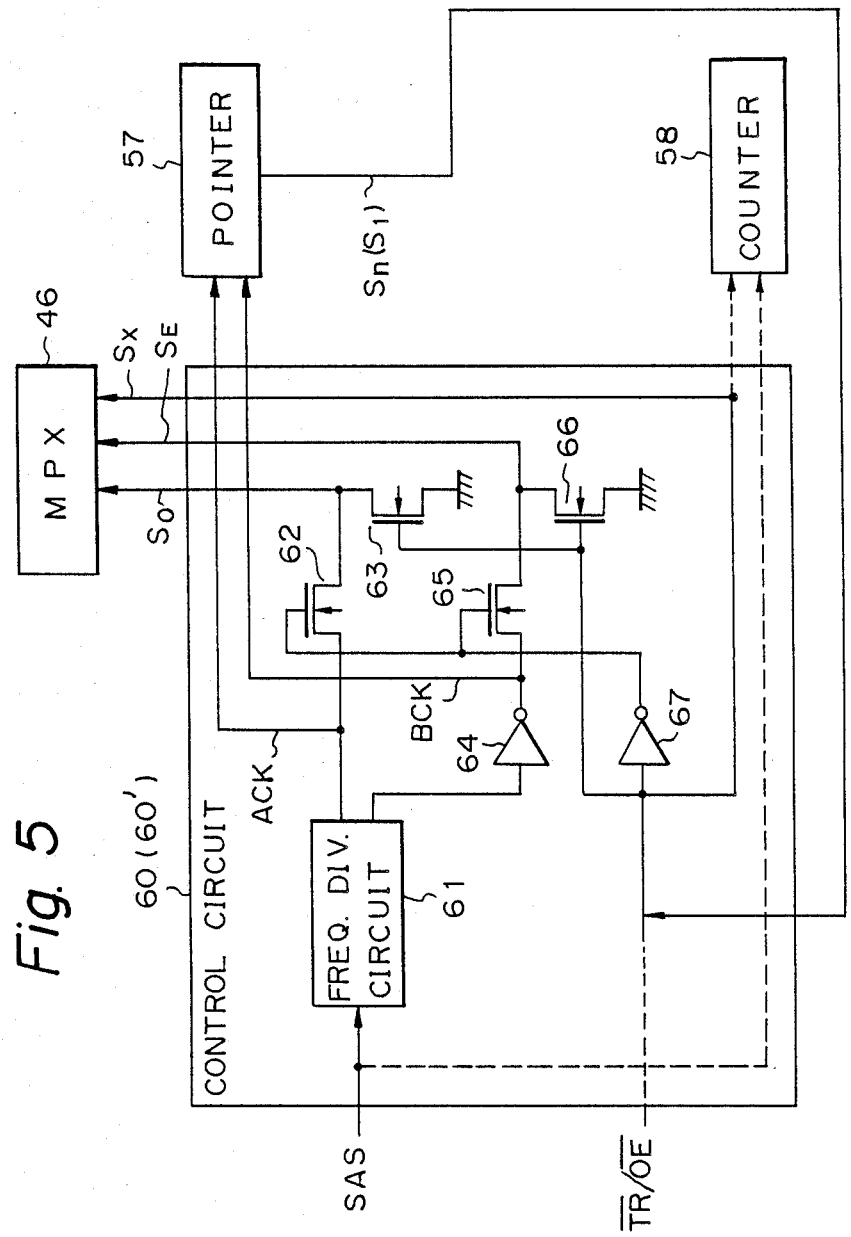

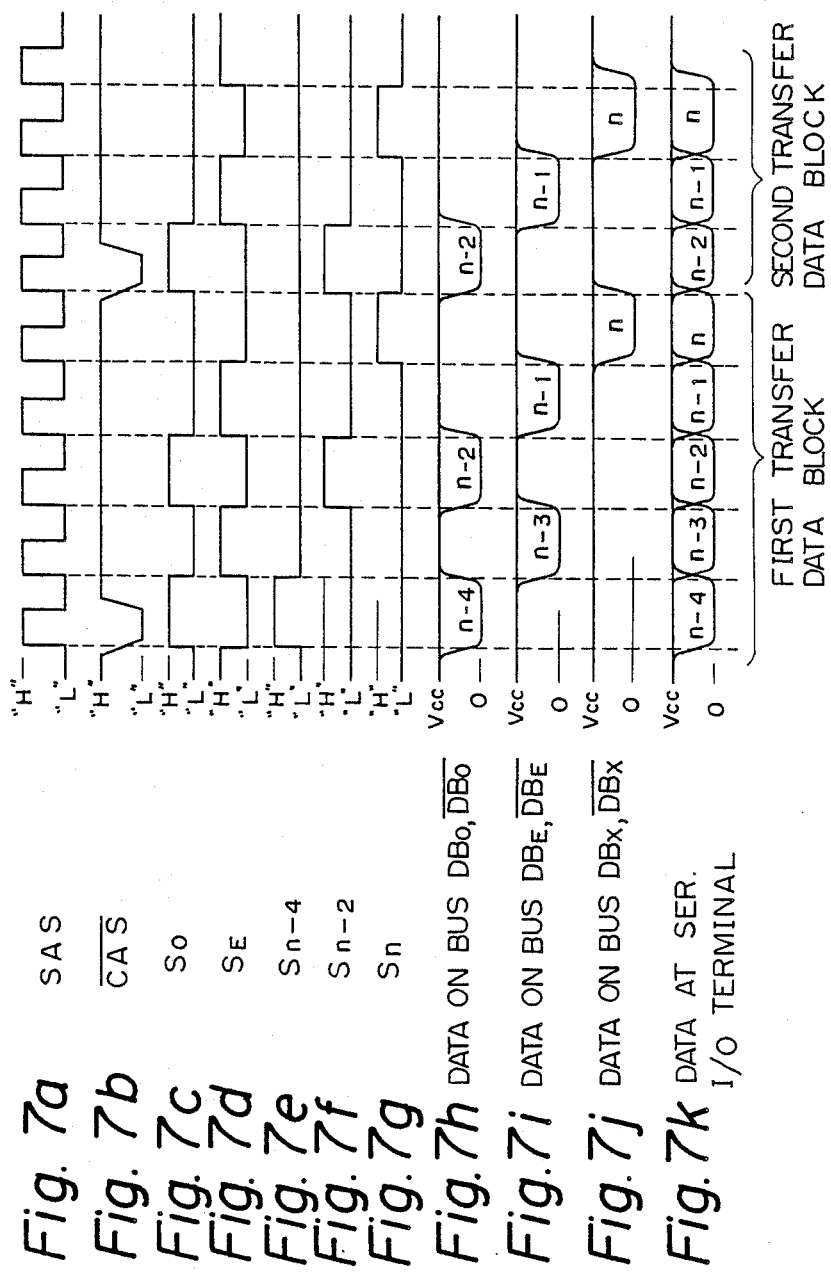

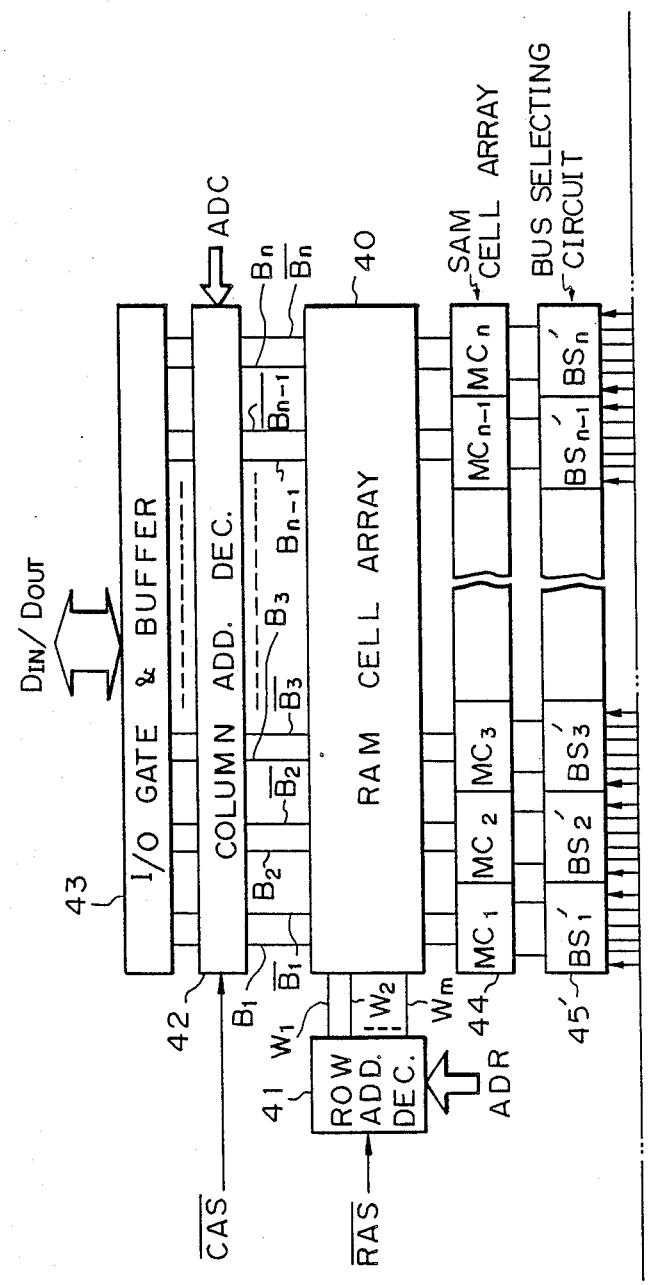

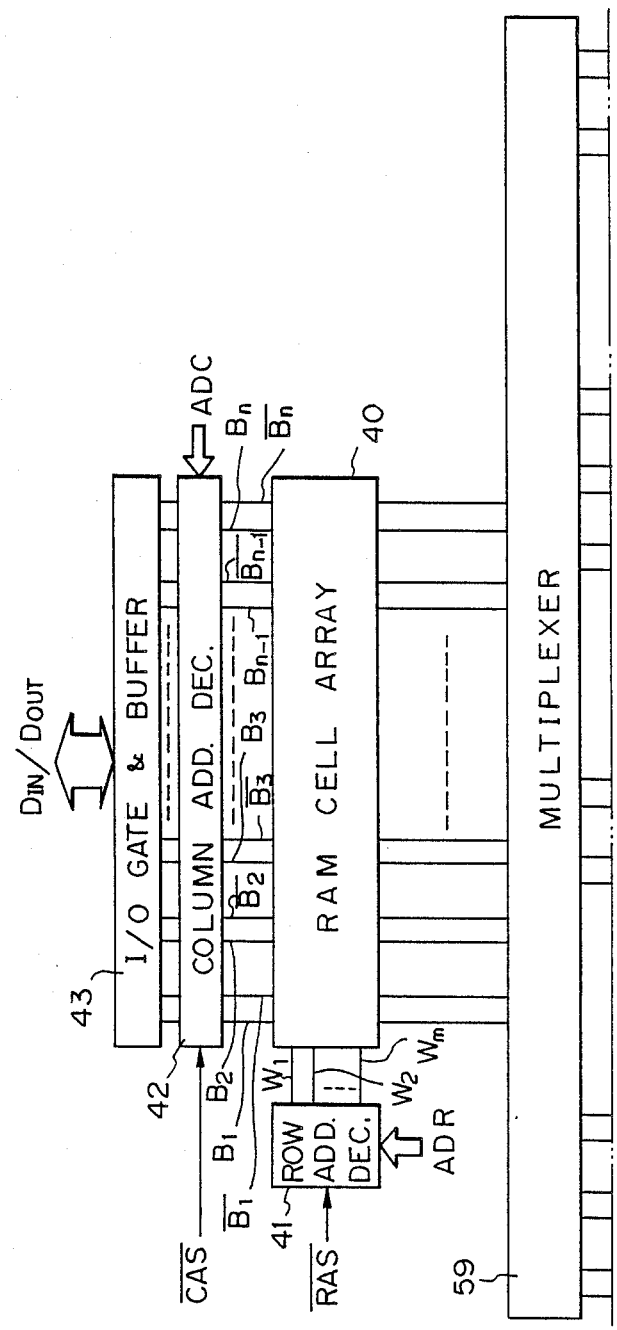

SEMICONDUCTOR MEMORY DEVICE WITH SERIAL ACCESS MEMORY

BACKGROUND OF THE INVENTION

1. Field of the Invention

The present invention relates to a semiconductor memory device and, more particularly, to a memory device including a serial access memory (SAM) employed for a serial access of data together with a random access memory (RAM) employed for an ordinary random access of data.

In general, a semiconductor memory device used as a memory for image processing such as a frame buffer requires that a data read operation is carried out with a high speed corresponding to a display speed on an image plane of a display attachment. For example, in a display having pixels of 512×512, a flicker arises on the image plane unless data are read out with a cycle of approximately 48 ns. The read speed in the image memory is approximately ten times as high as that in an ordinary dynamic RAM. Also, the read of display data from the frame buffer must be carried out serially and with high speed, while the write of date into the buffer must be simultaneously carried out. In order to realize the read/write operation by means of a ordinary dynamic RAM, measures to utilize a period for retrace line or to effect a time-sharing processing by means of a special method must be taken, because no more than one input/output (I/O) port is provided on the RAM. This leads to a difficulty in improvement in the efficiency in the write or change of data.

2. Description of the Related Art

As a frame buffer meeting the above requirements, a semiconductor memory device of a so-called dual port type is known and employed which includes both a random access port for a dynamic RAM and a serial access port for a SAM.

In a known example of this kind of the semiconductor memory device, the SAM is provided between the RAM and a serial I/O terminal and includes memory cells corresponding to a single row in the RAM, and a data bus for transferring serial data is provided between the SAM and the serial I/O terminal and divided into two systems. One is a data bus allocated to bit data corresponding to odd number address in the SAM, and the other is a data bus allocated to bit data corresponding to even number addresses therein.

In this arrangement, data are transferred between the RAM and SAM with a unit of an arbitrary single row in the RAM. For example, assuming that a display is connected to the serial I/O terminal and data in the RAM are transferred to the display. The data in the RAM are first read with a unit of a single row and stored in the SAM, and then, the stored data are read as a chain of serial data beginning from a bit data corresponding to a predetermined head address and transferred via the data bus to the display. In this case, when the data transfer between the RAM and SAM is carried out, the serial data transfer between the SAM and serial I/O terminal is not carried out, and vice versa. Accordingly, when the serial data transfer is carried out, the RAM and SAM can function independently of each other, so that the write operation of data can be freely carried out in the RAM. This contributes to improvement in the efficiency in the write or change of data.

Also, in the serial data transfer operation, each of bit data output from the SAM is read alternately on a first data bus for odd number addresses and a second data bus for even number addresses. Namely, when a first data bus is used in the serial data transfer, a second data bus is brought to a quiescent state, and vice versa. Accordingly, when one of the data buses participates in the serial data transfer, the other thereof can be brought to a reset state and prepared for the next participation in the serial data transfer. This contributes to a high speed read of data. As a result, a chain of serial data can be obtained without interruption at the serial I/O terminal.

However, the semiconductor memory device having the data bus divided into two systems poses a problem where the serial data transfer is carried out repeatedly with a unit of a data block of a plurality of bit data. For example, where the last address of a transfer data block and the head address of a subsequent one coincide with an odd or even number address, the respective bit data serially appears on an identical data bus and, accordingly, it becomes impossible to secure a reset period for the data bus. To prevent this disadvantage, the subsequent data block must be output with being delayed by a time period necessary for the resetting of the data bus. As a result, interruption equal to the predetermined reset period is inevitably generated between the transfer data blocks. This leads to a decrease in the read speed of data and thus is not preferable.

SUMMARY OF THE INVENTION

An object of the present invention is to provide a semiconductor memory device capable of preventing interruption from being generated between transfer data blocks in a serial data transfer and increasing the data transfer speed.

The above object is attained by providing a third data bus for transferring an information corresponding to the head address or last address of a transfer data block.

Therefore, according to the present invention, there is provided a semiconductor memory device including: a first memory cell array having a plurality of random access memory cells arrayed in a row direction and a column direction; a second memory cell array operatively connected to the first memory cell array and having at least serial access memory cells corresponding to a single row of the first memory cell array; a first data bus allocated to serial access memory cells corresponding to odd number addresses; a second data bus allocated to serial access memory cells corresponding to even number addresses; a third data bus allocated to at least one specific serial access memory cell; and a bus switching control circuit for controlling a connection of each of the serial access memory cells to one of the first, second and third data buses and selecting one of the data buses to connect the selected data bus to the external of the device, the bus switching control circuit outputting each of bit data in the serial access memory cells serially and alternately to the first and second data buses and, where a plurality of transfer data blocks are serially read out from the second memory cell array, outputting a bit data in the at least one specific serial access memory cell corresponding to the head or last address in each of the transfer data blocks to the third data bus.

BRIEF DESCRIPTION OF THE DRAWINGS

Other objects and features of the present invention will be described hereinafter in detail by way of the preferred embodiments with reference to the accompanying drawings, in which;

FIGS. 2a to 2f are waveform diagrams for explaining an operation of the device shown in FIG. 1;

FIGS. 3a to 3f are waveform diagrams for explaining a problem in the device shown in FIG. 1;

FIG. 5 is a circuit diagram illustrating a constitution of the control circuit shown in FIG. 4;

FIGS. 7a to 7k are waveform diagrams for explaining an operation of the device shown in FIG. 4;

FIGS. 8A and 8B show a circuit diagram illustrating a constitution of another embodiment of the present invention;

FIGS. 12A, 12B and 12C show a circuit diagram illustrating a constitution of another modification of the embodiment shown in FIG. 4.

DESCRIPTION OF THE PREFERRED EMBODIMENTS

For a better understanding of the preferred embodiments, the problems of the prior art will now be explained with reference to FIGS. 1 to 3f.

Figure 1:
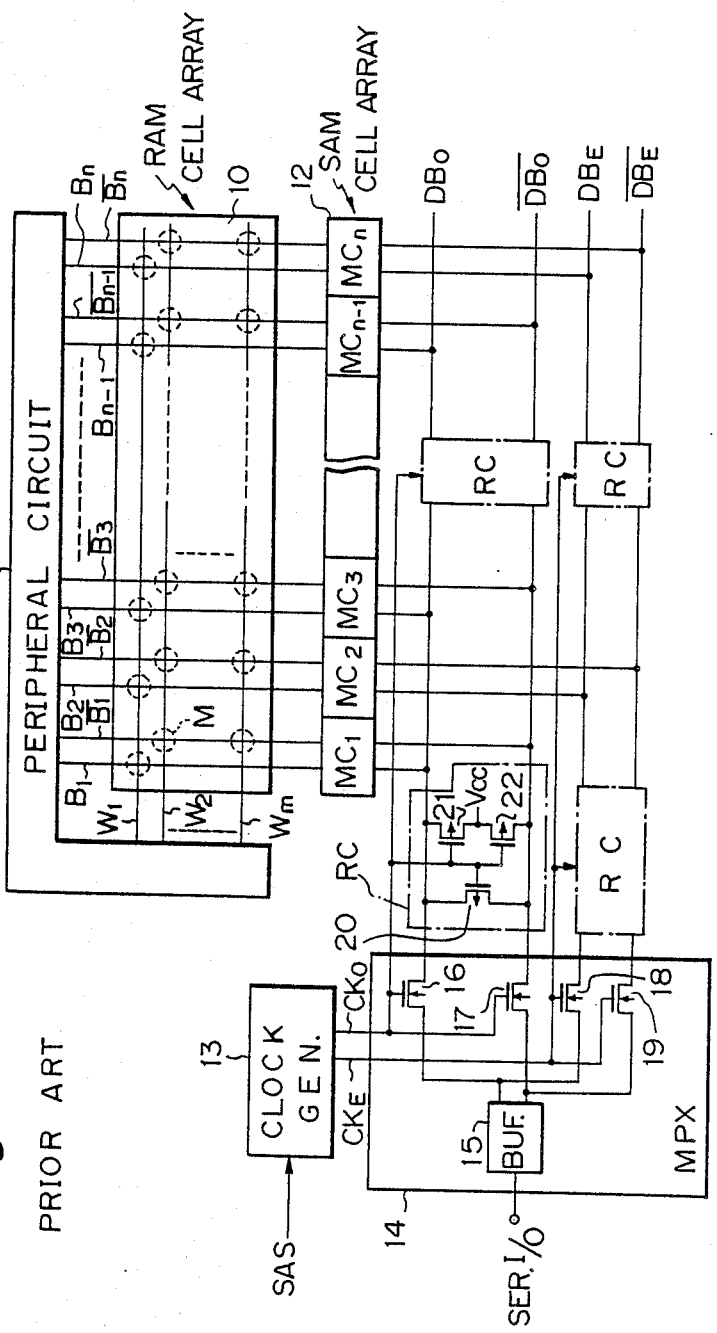
FIG. 1 is a circuit diagram illustrating a constitution of an example of the prior art semiconductor memory device with a SAM.

FIG. 1 shows a circuit constitution of the prior art memory device with a serial access memory (SAM).

In FIG. 1, reference 10 denotes a RAM cell array having a memory cell M provided at each intersection between a plurality of word lines $W_1$-$W_m$ and a plurality of pairs of bit lines $B_1$, $\overline{B_1}$-$B_n$, $\overline{B_n}$. Reference 11 denotes a peripheral circuit including a decoder arrangement for selecting one of the word lines and one of the pairs of bit lines. Reference 12 denotes a SAM cell array having a memory cell $MC_1$-$MC_n$ provided for each of the pairs of bit lines. The memory cells $MC_1$, $MC_3$, $MC_5$, ..., $MC_{n-1}$ corresponding to odd number addresses are connected to a pair of data lines $DB_0$, $\overline{DB_0}$ (data bus for odd number addresses) and the memory cells $MC_2$, $MC_4$, $MC_6$, ..., $MC_n$ corresponding to even number ones are connected to another pair of data lines $DB_E$, $\overline{DB_E}$ (data bus for even number addresses). Each of bit data in the memory cells $MC_1$-$MC_n$ is serially read out. Reference 13 denotes a clock generator, which receives a serial access strobe (SAS) signal, divides a frequency of the SAS signal, and generates clocks $CK_0$ and $CK_E$ so that, when one of the clocks is at logical high ("H") level, the other is at logical low ("L") level, and vice versa. Reference 14 denotes a multiplexer, which includes N-channel metal oxide semiconductor (NMOS) transistors 16, 17, 18 and 19 connected in series with each of the data lines $DB_0$, $\overline{DB_0}$, $DB_E$ and $\overline{DB_E}$, respectively, and a buffer 15 connected between the transistors 16-19 and a serial I/O terminal. The transistors 16 and 17 brings the data bus $DB_0$ and $\overline{DB_0}$ to a closed or open state in response to the clock $CK_0$, while the transistors 18 and 19 brings the data bus $DB_E$ and $\overline{DB_E}$ to a closed or open state in response to the clock $CK_E$. Reference RC denotes a reset circuit, which includes a P-channel MOS (PMOS) transistor 20 connected between the data lines $DB_0$, $\overline{DB_0}$ (or $DB_E$, $\overline{DB_E}$) and PMOS transistor 21, 22 connected in series therebetween. When the clock $CK_0$ (or $CK_E$) is at "L" level, the reset circuit RC short-circuits the data lines $DB_0$, $\overline{DB_0}$ (or $DB_E$, $\overline{DB_E}$) and brings them to a level of $V_{cc}$. Namely, the reset circuit RC has a function of bringing the corresponding data bus to a reset state.

In the above arrangement, the data in the RAM cell array 10 are read out with a unit of an arbitrary single row, i.e., n bit data, and stored in the SAM cell array 12. The stored data are serially read in response to the SAS signal. On the other hand, as shown in FIGS. 2a to 2f, which are timing charts indicating the operation of the device of FIG. 1, the clocks $CK_0$ and $CK_E$ are alternately raised to "H" level in synchronization with the rise of the SAS signal. When the clock $CK_0$ is raised to "H" level, the transistors 16 and 17 in the multiplexer 14 are turned ON and the transistors 20, 21 and 22 in the corresponding reset circuit RC are turned OFF. In this state, the bit data for odd number addresses in the SAM cell array 12 can be read via the data bus $DB_0$, $\overline{DB_0}$ and the buffer 15 to the serial I/O terminal. Likewise, when the clock $CK_E$ is at "H" level, the bit data for even number addresses can be read via the data bus $DB_E$, $\overline{DB_E}$ and the buffer 15 to the serial I/O terminal.

Therefore, according to the circuit constitution of FIG. 1, the bit data in the SAM cell array 12 are output alternately and serially to the data buses $DB_0$, $\overline{DB_0}$ and $DB_E$, $\overline{DB_E}$, and read out without interruption to the serial I/O terminal, as shown in FIG. 2f. Note, reference $t_R$ in FIGS. 2d and 2e indicates a reset period in which the corresponding data bus is brought to the reset state.

Next, a problem in the device of FIG. 1 will be explained with reference to FIGS. 3a to 3f.

Assuming that bit data "1" to "5" among the n bit data stored in the SAM cell array 12 are allocated to a first transfer data block, and bit data following a bit data "9" are allocated to a second one. In this case, the last data of the first transfer data block and the head data of the second transfer data block coincide with the odd number address. Accordingly, the bit data "5" and "9" appear in sequence on the data bus $DB_0$, $\overline{DB_0}$ for odd number addresses. In this case, since the bit data "5" and "9" are output to the data bus in response to the rise of the SAS signal, a reset period $t_O$ corresponding to one cycle of the SAS signal is generated between the bit data "5" and "9". As a result, interruption equal to one cycle of the SAS signal is inevitably generated between the transfer data blocks output from the serial I/O terminal.

Although the number of the transfer data blocks is two in the illustrated example, the above interruption would become longer to such an extent that it cannot be disregarded where the number of the blocks is increased. This leads to a lowering in the data transfer speed and thus is not preferable.

A preferred embodiment of the present invention will now be described in detail with reference to FIGS. 4 to 7k.

Figure 4A:
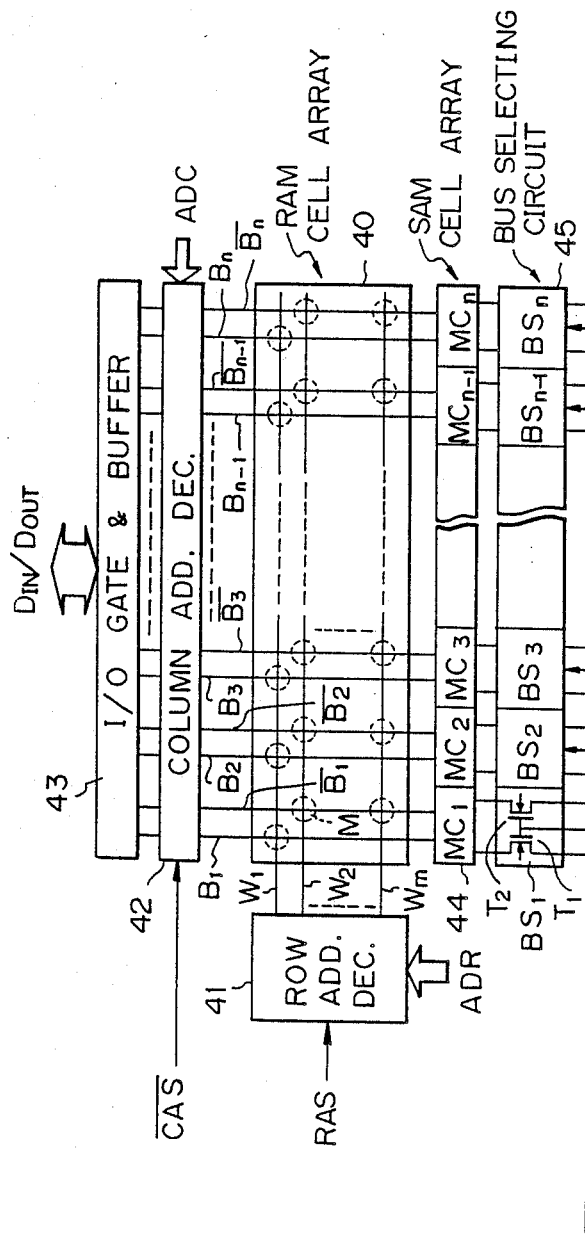
FIGS. 4A and 4B show a circuit diagram illustrating a constitution of the semiconductor memory device with a SAM as an embodiment of the present invention.
Figure 4B:
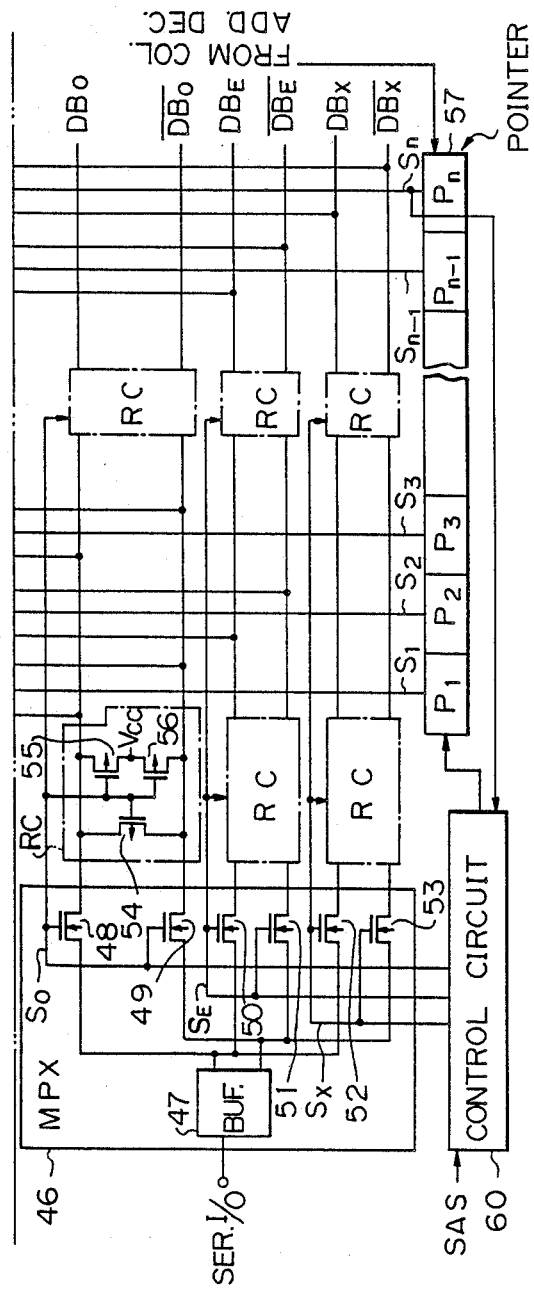

FIGS. 4A and 4B illustrate a circuit constitution of the semiconductor memory device with a SAM as an embodiment of the present invention. The illustrated constitution is applied to a video RAM device in the form of a chip.

Roughly classifying, the device of FIG. 4 is constituted by; a RAM cell array 40 having a memory cell M provided at each intersection between a plurality of word lines $W_1$-$W_m$ and a plurality of pairs of bit lines $B_1$, $\overline{B_1}$-$B_n$, $\overline{B_n}$; a random access port portion for effecting an ordinary random access to the RAM cell array; a SAM cell array 44 having a plurality of memory cells $MC_1$-$MC_n$ corresponding to a memory capacity of a single row of the RAM cell array; and a serial access port portion for effecting a serial data access to the SAM cell array. The random access port portion includes; a row address decoder 41 which inputs a row address signal ADR in response to a fall of a low active row address strobe signal $\overline{RAS}$, selects a word line designated by the row address signal and activates the selected word line; a column address decoder 42 which inputs a column address signal ADC in response to a fall of a low active column address strobe signal $\overline{CAS}$, selects a pair of bit lines designated by the column address signal and activates the selected pair of bit lines; and an I/O gate and buffer 43 for effecting the input and output of data ($D_{IN}/D_{OUT}$) between the column address decoder 42 and the external in the ordinary random access operation.

The serial access port portion is constituted by a bus selecting circuit 45 having a selecting circuit $BS_1$-$BS_n$ provided for each of the cells in the SAM cell array 44, a multiplexer 46, three pairs of data lines $DB_0$, $\overline{DB_0}$; $DB_E$, $\overline{DB_E}$; $DB_X$, $\overline{DB_X}$, six reset circuits RC provided at an end and halfway on each pair of data lines, a pointer 57 having a pointer circuit $P_1$-$P_n$ provided for each of the selecting circuits $BS_1$-$BS_n$, and a control circuit 60. A first pair of data lines (data bus) $DB_0$, $\overline{DB_0}$ are connected between the multiplexer 46 and the bus selecting circuits $BS_1$, $BS_3$, $BS_5$, ..., which are connected to the memory cells $MC_1$, $MC_3$, $MC_5$, ..., corresponding to odd number addresses. A second pair of data lines (data bus) $DB_E$, $\overline{DB_E}$ are connected between the multiplexer 46 and the bus selecting circuits $BS_2$, $BS_4$, ..., $BS_{n-1}$, which are connected to the memory cells $MC_2$, $MC_4$, ..., $MC_{n-1}$ corresponding to even number addresses.. Also, a third pair of data lines (data bus) $DB_X$, $\overline{DB_X}$ are connected between the multiplexer 46 and the last bus selecting circuit $BS_n$, which is connected to the memory cell $MC_n$ corresponding to the last address. In the present example, the last address corresponds to an odd number address.

Each of the bus selecting circuits $BS_1$-$BS_n$ includes a pair of NMOS transistors $T_1$, $T_2$, which are connected in series with the lines which connect the corresponding memory cell $MC_1$-$MC_n$ to the corresponding data bus. The pair of transistors $T_1$, $T_2$ are turned ON in response to a bus select signal $S_1$-$S_n$ output from the corresponding pointer circuit $P_1$-$P_n$. At this time, each of the selecting circuits $BS_1$-$BS_{n-1}$ connects the corresponding SAM cell $MC_1$-$MC_{n-1}$ to the data bus $DB_0$, $\overline{DB_0}$ for odd number addresses or the data bus $DB_E$, $\overline{DB_E}$ for even number addresses, except that the selecting circuit $BS_n$ connects the SAM cell $MC_n$ to the data bus $DB_X$, $\overline{DB_X}$ for the last address.

The multiplexer 46 includes NMOS transistors 48, 49, 50, 51, 52 and 53 connected in series with each of the data lines $DB_0$, $\overline{DB_0}$, $DB_E$, $\overline{DB_E}$, $DB_X$ and $\overline{DB_X}$, respectively, and a buffer 47 connected between the transistors 48-53 and a serial I/O terminal. The transistors 48 and 49 brings the data bus $DB_0$ and $\overline{DB_0}$ to a closed or open state in response to a control clock $S_0$ output from the control circuit 60, the transistors 50 and 51 brings the data bus $DB_E$ and $\overline{DB_E}$ to a closed or open state in response to a control clock $S_E$ output from the control circuit 60, and the transistors 52 and 53 brings the data bus $DB_X$ and $\overline{DB_X}$ to a closed or open state in response to a control clock $S_X$ output from the control circuit 60. Each of six reset circuits RC includes a PMOS transistor 54 connected between the corresponding pair of data lines and PMOS transistors 55, 56 connected in series therebetween, and short-circuits the corresponding pair of data lines to bring them to the reset state when the control clock $S_0$, $S_E$ or $S_X$ from the control circuit 60 is at "L" level.

Next, a circuit constitution of the control circuit 60 will be described with reference to FIG. 5.

The control circuit 60 in the present example is constituted by a frequency dividing circuit 61 which responds to the rise of a serial access strobe (SAS) signal and generates a couple of frequency divided signals ACK indicating odd number addresses in the SAM cell array 44, an NMOS transistor 62 which responds to an output signal of an inverter 67 and transmits the frequency divided signal ACK to the multiplexer 46 as the control clock $S_0$, an NMOS transistor 63 which responds to the bus select signal $S_n$ fed from the last pointer circuit $P_n$ and pulls the control clock $S_0$ down to "L" level, an inverter 64 which inverts the frequency divided signal ACK to a signal BCK indicating even number addresses in the SAM cell array 44, an NMOS transistor 65 which responds to the output signal of the inverter 67 and transmits the signal BCK to the multiplexer 46 as the control clock $S_E$, an NMOS transistor 66 which responds to the bus select signal $S_n$ and pulls the control clock $S_E$ down to "L" level, and the inverter 67 responding to the bus select signal $S_n$. Note, the signal lines indicated by broken lines participate in another embodiment, which will be explained later.

According to the constitution of FIG. 5, when the bus select signal $S_n$ fed from the pointer 57 is at "L" level, the transistors 62 and 65 are in the ON state via the inverter 67 and the transistors 63 and 66 are in the OFF state, so that the signals ACK and BCK continue to be fed to the multiplexer 46 as the control clocks $S_0$ and $S_E$, respectively. In this state, the third control clock $S_X$ is at "L" level. The control clock $S_X$ is raised to "H" level when the bus select signal $S_n$ is at "H" level. At this time, the control clocks $S_0$ and $S_E$ is lowered to "L" level. Namely, as a whole, the control circuit 60 outputs the control clock $S_0$ for odd number addresses and the control clock $S_E$ for even number addresses alternately and serially in response to the rise of the SAS signal and, when the pointer 57 raises the signal $S_n$ indicating the last address in the SAM cell array to "H" level, outputs the third control clock $S_X$ replacing the control clocks $S_0$ and $S_E$.

A circuit constitution of the pointer 57 will be described with reference to FIG. 6.

Each pointer circuit $P_1$-$P_n$ of the pointer 57 substantially has an identical constitution, and is constituted by four PMOS transistors $Q_1$-$Q_4$ and eight NMOS transistors $Q_5$-$Q_{12}$. Each source of the transistors Q1 and Q2 is connected to a higher power supply line $V_{cc}$ (5 V), and each drain thereof is connected via transistors Q3, Q5 and Q4, Q6, respectively, to a lower power supply line $V_{ss}$ (0 V). Four transistors Q3-Q6 constitute a flip flop. The transistor Q7 (Q8) is connected in parallel to the transistor Q5 (Q6). The transistors Q9 and Q11 are connected in series between one of the output nodes of the flip flop and the power supply line $V_{ss}$, while the transistors Q10 and Q12 are connected in series between another of the output nodes thereof and the line $V_{ss}$.

The transistors Q1 and Q7 respond to a corresponding decode signal $PC_0$–$PC_{n-1}$, which is fed from the column address decoder 42. The decoder 42 decodes the column address signal ADC in response to the fall of the column address strobe signal $\overline{CAS}$ and, based on the decoding, selects one bit of n bits. Accordingly, for example, where the column address decoder 42 selects the pair of bit lines $B_3$, $\overline{B_3}$, the corresponding decode signal $PC_2$ is raised to "H" level and the other decode signals $PC_0$, $PC_1$ and $PC_3$–$PC_{n-1}$ are maintained to "L" level. The transistors Q2 and Q8 respond to a signal PR of a predetermined level, which is fixed to "L" level in the present example. The transistor Q9 of the pointer circuit $P_i$ responds to the output signal of the preceding pointer circuit $P_{i-1}$, i.e., the bus select signal $S_{i-1}$, except that the transistor Q9 of the first pointer circuit $P_1$ responds to a fixed level $V_{ss}$. The transistor Q10 of each pointer circuit $P_1$–$P_n$ responds to signals $SL_1$–$SL_n$, respectively. In the present example, the signal $SL_i$ corresponds to the output signal of the following pointer circuit $P_{i+1}$, i.e., the bus select signal $S_{i+1}$, except that the signal $SL_n$ in the last pointer circuit $P_n$ is fixed to "H" level. The transistors Q11 of the pointer circuits $P_1$, $P_3$, $P_5$, ..., $P_n$ for odd number addresses respond to the signal ACK fed from the control circuit 60, and the transistors Q12 thereof respond to the signal BCK fed from the control circuit 60. Contrary to this, the transistors Q11 of the pointer circuits $P_2$, $P_4$, $P_6$, ..., $P_{n-1}$ for even number addresses respond to the signal BCK, and the transistors Q12 thereof respond to the signal ACK.

Figure 6:
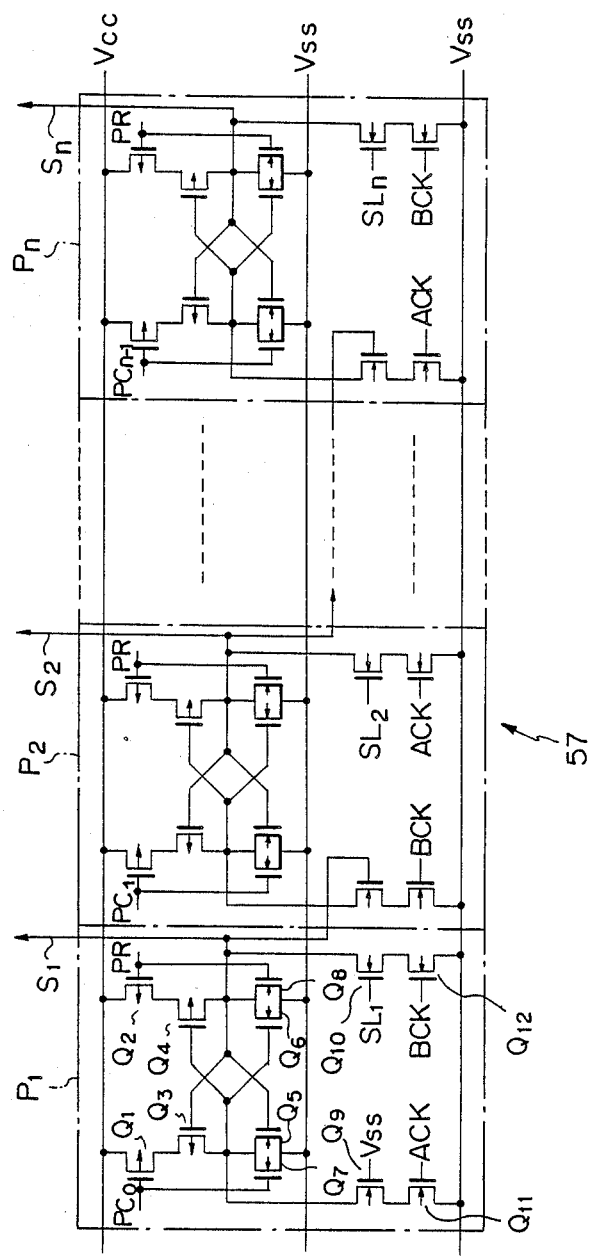
FIG. 6 is a circuit diagram illustrating a constitution of the pointer shown in FIG. 4.

According to the constitution of FIG. 6, for example, when the decode signal $PC_1$ is raised to "H" level, the transistor Q7 in the pointer circuit $P_2$ is turned ON and, accordingly, the transistor Q4 therein is turned ON. Since the signal PR is at "L" level, the output signal of the circuit $P_2$, i.e., the bus select signal $S_2$ is raised to "H" level. At this time, the signal ACK for odd number addresses is at "L" level and the signal BCK for even number addresses is at "H" level. Therefore, when the signal $S_2$ of "H" level is applied to the transistor Q10 in the preceding pointer circuit $P_1$, the bus select signal $S_1$ is lowered to "L" level. Also, the signal $S_2$ of "H" level is applied to the transistor Q9 in the following pointer circuit $P_3$, too. When the signal ACK is raised to "H" level in response to the next rise of the SAS signal (see FIG. 5), the transistors Q9 and Q11 in the pointer circuit $P_3$ are brought to the ON state, so that the drain of the transistor Q7 therein is pulled down to "L" level. As a result, the transistor Q4 in the circuit $P_3$ is turned ON, so that the bus select signal $S_3$ is raised to "H" level. At this time, the signal ACK is at "H" level. Therefore, when the signal $S_3$ of "H" level is applied to the transistor Q10 in the preceding circuit $P_2$, the bus select signal $S_2$ is lowered to "L" level.

Thus, as a whole, the pointer 57 functions as a kind of a preset counter. Namely, in the transfer mode between the RAM and SAM, when the decode signal $PC_0$–$PC_{n-1}$ fed from the column address decoder 42 based on the decoding of the column address signal ADC input at the fall of the signal $\overline{CAS}$ is input to the pointer 57, the bus select signal $S_1$–$S_n$ of the corresponding pointer circuit $P_1$–$P_n$ is preset to "H" level, i.e., "1". When the arbitrary pointer circuit is brought to the preset state in accordance with the timing of the fall of the signal $\overline{CAS}$, the pointer 57 counts up the preset value one by one in response to the signal ACK or BCK and outputs each of the select signals $S_1$–$S_n$ in sequence. For example, where the preset value is "1" for the first circuit $P_1$, the bus select signal $S_1$ is first raised to "H" level and, then, the signal $S_2$, $S_3$, ..., $S_n$ is raised to "H" level in sequence. When the last select signal $S_n$ is output, it is fed to the control circuit 60 and, then, transmitted to the multiplexer 46 as the control clock $S_X$ (see FIG. 5).

Next, the operation of the device of FIG. 4 will be explained with reference to FIGS. 7a to 7k.

In the illustrated example, it is assumed that bit data "n−4" to "n" among the n bit data stored in the SAM cell array 44 are allocated to a first transfer data block, and that bit data "n−2" to "n" thereamong are allocated to a second one. Therefore, in this case, the column address strobe signal $\overline{CAS}$ needs to be lowered to "L" level at a timing such that the column address decoder 42 can select the pairs of bit lines $B_{n-4}$, $\overline{B_{n-4}}$ and $B_{n-2}$, $\overline{B_{n-2}}$ corresponding to the bit data "n−4" and "n−2".

First, when the signal $\overline{CAS}$ is lowered to "L" level in synchronization with the first rise of the SAS signal, the decode signal $PC_{n-5}$ of the corresponding pointer circuit $PC_{n-4}$ (see FIG. 6) is raised to "H" level, so that the corresponding select signal $S_{n-4}$ is raised to "H" level. As a result, the transistors $T_1$ and $T_2$ of the corresponding bus selecting circuit $BS_{n-4}$ are turned ON, so that the bit data "n−4" of the corresponding SAM cell $MC_{n-4}$ is read on the data bus $DB_0$, $\overline{DB_0}$ for odd number addresses. On the other hand, when the first SAS signal is raised to "H" level, the control clock $S_O$ for odd number addresses is output from the control circuit 60. Thus, the transistors 48 and 49 in the multiplexer 46 are turned ON and the corresponding reset circuits RC cannot function. As a result, the bit data "n−4" on the data bus $DB_0$, $\overline{DB_0}$ is output via the multiplexer 46 to the serial I/O terminal.

Next, when the second SAS signal is raised to "H" level, the next select signal $S_{n-3}$ (not shown) is raised to "H" level, so that the bit data "n−3" is read on the data bus $DB_E$, $\overline{DB_E}$ for even number addresses. On the other hand, since the control clock $S_E$ for even number addresses is output in response to the second SAS signal, only the transistors 50 and 51 in the multiplexer 46 are turned ON. As a result, the bit data "n−3" on the data bus $DB_E$, $\overline{DB_E}$ is output to the serial I/O terminal. Likewise, the bit data "n−2" and "n−1" are read on the data bus $DB_0$, $\overline{DB_0}$ and $DB_E$, $\overline{DB_E}$, respectively, and serially output to the serial I/O terminal. According, as shown in FIG. 7k, the bit data "n−4" to "n−1" are output to the serial I/O terminal without interruption.

When the fifth SAS signal is raised to "H" level, the last pointer circuit $P_n$ functions, so that the select signal $S_n$ is raised to "H" level. As a result, the transistors $T_1$ and $T_2$ of the last selecting circuit $BS_n$ are turned ON, so that the bit data "n" is read on the third data bus $DB_X$, $\overline{DB_X}$. At the same time, the control circuit 60 pulls the control clocks $S_0$ and $S_E$ down to "L" level and output the control clock $S_X$ of "H" level. When the transistors 52 and 53 in the multiplexer 46 are turned ON in response to the control clock $S_X$ of "H" level, the bit data "n" on the data bus $DB_X$, $\overline{DB_X}$ is output to the serial I/O terminal. Therefore, as shown in FIG. 7k, the bit data "n" is output to the I/O terminal without interruption, following the bit data "n−1".

Also, while the last bit data "n" is being output via the third data bus $DB_X$, $\overline{DB_X}$, both of the data buses $DB_0$, $\overline{DB_0}$ and $DB_E$, $\overline{DB_E}$ are brought to the level of $V_{cc}$, i.e., the reset state. Accordingly, when the bit data corresponding to the head address, "n−2" in the present example, of the next transfer data block is transferred the resetting of the data bus $DB_0$, $\overline{DB_0}$ corresponding to the bit data "n−2" is already completed. Thus, the head bit data "n−2" of the second data block is output to the serial I/O terminal without interruption, following the last bit data "n" of the first data block.

Note, since the transfer operation of the second data block is easily deduced from that of the first data block, the explanation thereof will be omitted.

As explained above, the device according to the present embodiment is provided with the third data bus and constituted such that the information corresponding to the last address of a transfer data block is read on the third data bus and output to the serial I/O terminal. Therefore, when the last bit data is output via the third data bus, it is possible to fully reset the data bus for odd number addresses and the data bus for even number addresses. Thus, irrespective of whether the head bit data of the next data block is for an odd number address or for an even number address, the head bit data can be output to the I/O terminal without interruption, following the last bit data of the first data block. This contributes to the increase in the speed of the serial data transfer between the SAM cell array and the serial I/O terminal.

Next, another embodiment of the present invention will be described with reference to FIGS. 8 and 8B to $10_n$.

Figure 8B:
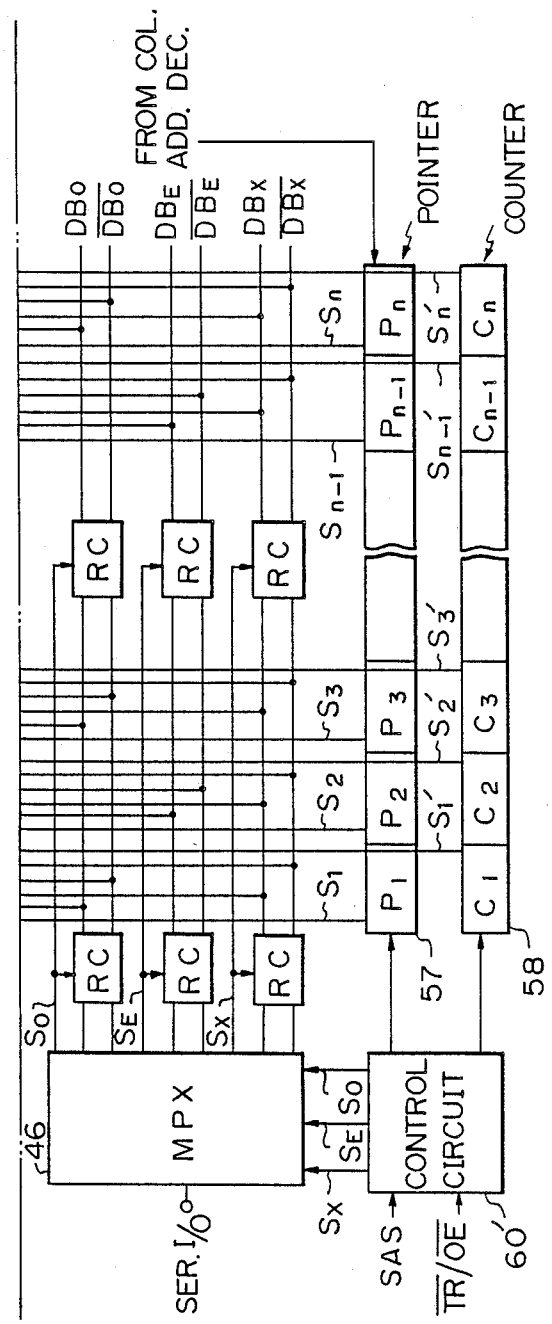

The device shown in FIGS. 8A and 8B are characterized in that the last address of a transfer data block is selectable, although, in the device of FIG. 4 the last address is fixed to "n". Since the circuit constitution of FIG. 8 and the operation thereof are the same as those of FIG. 4 in most parts, only the differences between them are hereinafter referred to.

In the embodiment of FIGS. 8A and 8B, the third data bus $DB_X$, $\overline{DB_X}$ is connected between the multiplexer 46 and all of the bus selecting circuits $BS_1'$-$BS_n'$. Also, referring to FIG. 5, the control circuit 60' outputs the control clock $S_X$ in response to an external control signal $\overline{TR/OE}$, although, in the embodiment of FIG. 4, the control clock $S_X$ is determined by the bus select signal $S_n$ from the pointer 57. In the present embodiment, the control signal $\overline{TR/OE}$ is raised to "H" level at a timing such that the column address decoder can select a pair of bit lines corresponding to the last address of a transfer data block. Accordingly, the control circuit 60' has a function of detecting the last address of the transfer data block based on the logical level of the control signal $\overline{TR/OE}$.

Reference 58 denotes a counter having a counter circuit $C_1$-$C_n$ provided for each of the selecting circuits $BS_1'$-$BS_n'$. The counter 58 responds to the SAS signal and the control signal $\overline{TR/OE}$, raises one of bus change signals $S_1'$-$S_n'$ to "H" level, and supplies the "H" level signal to the corresponding bus selecting circuit $BS_1'$-$BS_n'$. For example, when the control signal $\overline{TR/OE}$ is raised to "H" level in synchronization to the fifth rise of the SAS signal, the control circuit 60' detects that the last address of the transfer data block is "5". As a result, the counter 58 raises only the fifth bus change signal $S_5'$ to "H" level and transmits it to the corresponding bus selecting circuit $BS_5'$.

Next, a circuit constitution of the bus selecting circuit 45' shown in FIGS. 8A and 8B will be described with reference to FIG. 9. Note, the illustration of FIG. 9 representatively shows the constitution of the selecting circuit $BS_1'$.

Figure 9:
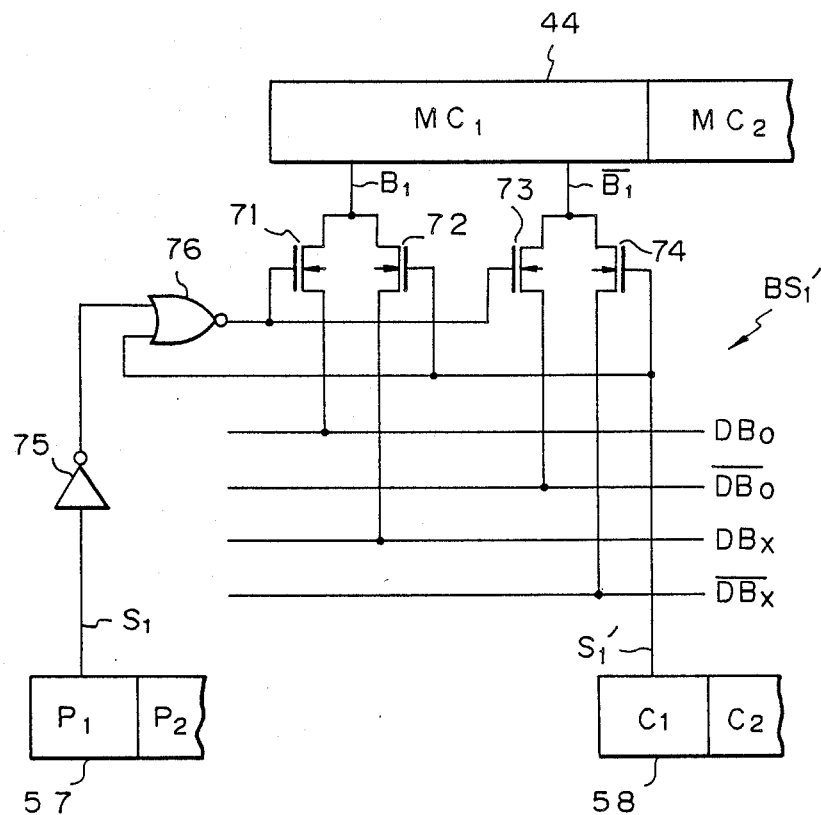
FIG. 9 is a circuit diagram partially illustrating a constitution of the bus selecting circuit shown in FIG. 8.

The bus selecting circuit $BS_1'$ illustrated in FIG. 9 is constituted by an NMOS transistor 71 which responds to an output signal of an NOR gate 76 and connects the bit line $B_1$ of the corresponding SAM cell MC, to the data line $DB_0$, an NMOS transistor 72 which to the bus change signal $S_1'$ from the corresponding counter circuit $C_1$ and connects the bit line $B_1$ to the data line $DB_X$, an NMOS transistor 73 which responds to the output signal of the NOR gate 76 and connects the complementary bit line $\overline{B_1}$ to the complementary data line $\overline{DB_0}$, an NMOS transistor 74 which responds to the bus change signal $S_1'$ and connects the bit line $\overline{B_1}$ to the complementary data line $\overline{DB_X}$, an inverter 75 responding to the bus select signal $S_1$ from the corresponding pointer circuit $P_1$, and the NOR gate 76 responding to the output signal of the inverter 75 and the bus change signal $S_1'$.

According to the constitution of FIG. 9, when the bus change signal $S_1'$ is at "L" level and the bus select signal $S_1$ is at "H" level, the transistors 71 and 73 are turned ON, so that the bit data in the SAM cell $MC_1$ is read on the data bus $DB_0$, $\overline{DB_0}$ for odd number addresses. On the other hand, when the bus change signal $S_1'$ is at "H" level, i.e., when the last address of the transfer data block is detected, the transistors 72 and 74 are turned ON in place of the transistors 71 and 73, so that the bit data is read on the third data bus $DB_X$, $\overline{DB_X}$.

Figure 10:
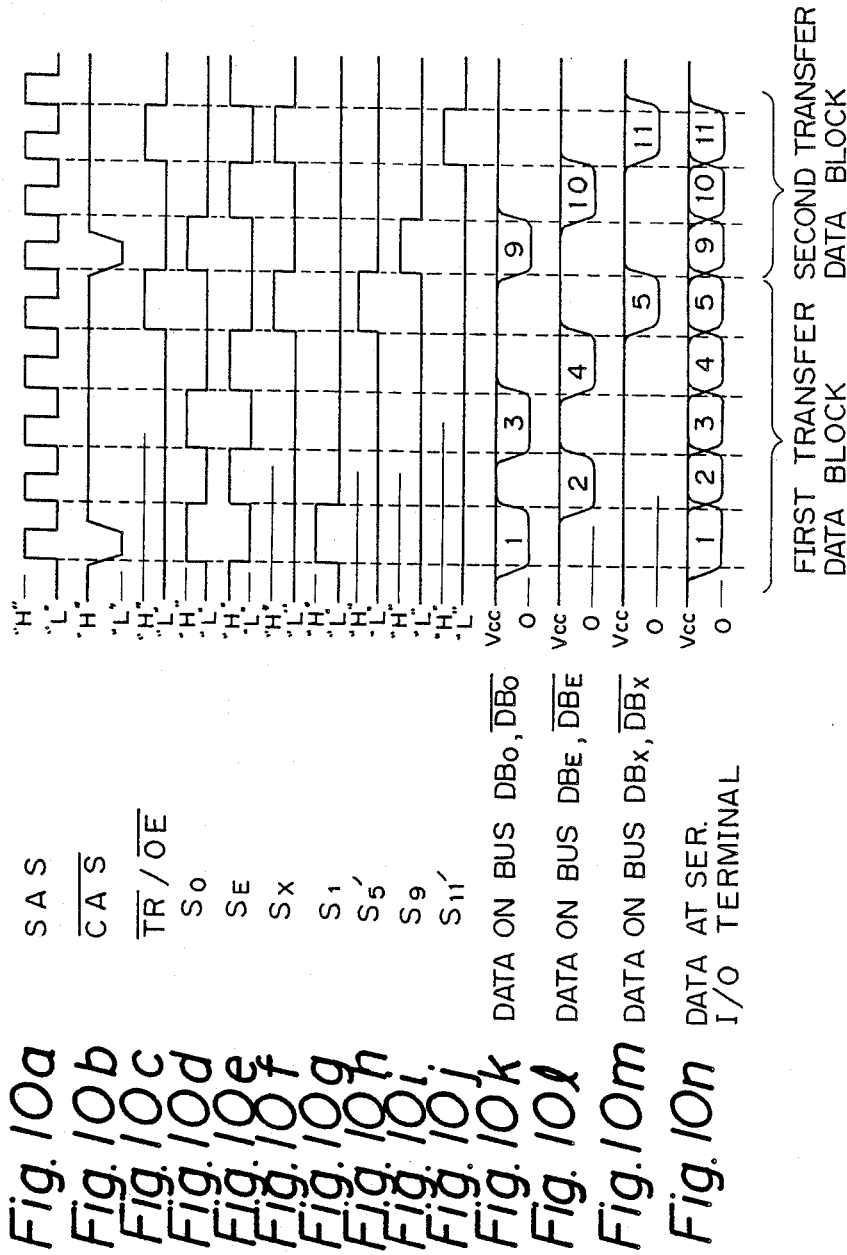
FIGS. 10a to 10n are waveform diagrams for explaining an operation of the device shown in FIG. 8.

FIGS. 10a to 10n are timing charts indicating the operation of the device of FIG. 8.

In the illustrated example, it is assumed that bit data "1" to "5" among the n bit data stored in the SAM cell array 44 are allocated to the first transfer data block, and that bit data "9" to "11" thereamong are allocated to the second one. Also, the read and output of the head bit data of the transfer data block are determined by the timing of the fall of the signal $\overline{CAS}$, and those of the last bit data thereof are determined by the timing of the rise of the external control signal $\overline{TR/OE}$. Since the forms of generation of the other signals are easily deduced from those in the embodiment of FIG. 4, the explanation thereof will be omitted.

According to the embodiment of FIGS. 8A and 8B as well as that of FIGS. 4A and 4B, the device is constituted such that the bit data corresponding to the last address of the transfer data block is read on the third data bus $DB_X$, $\overline{DB_X}$ and output via the multiplexer 46 to the serial I/O terminal. Therefore, during the serial data transfer, both of the data buses $DB_0$, $\overline{DB_0}$ and $DB_E$, $\overline{DB_E}$ can be fully reset. As a result, the head bit data "9" of the second data block can be output to the I/O terminal without interruption, following the last bit data "5" of the first data block, as shown in FIG. 10n.

Figure 11:
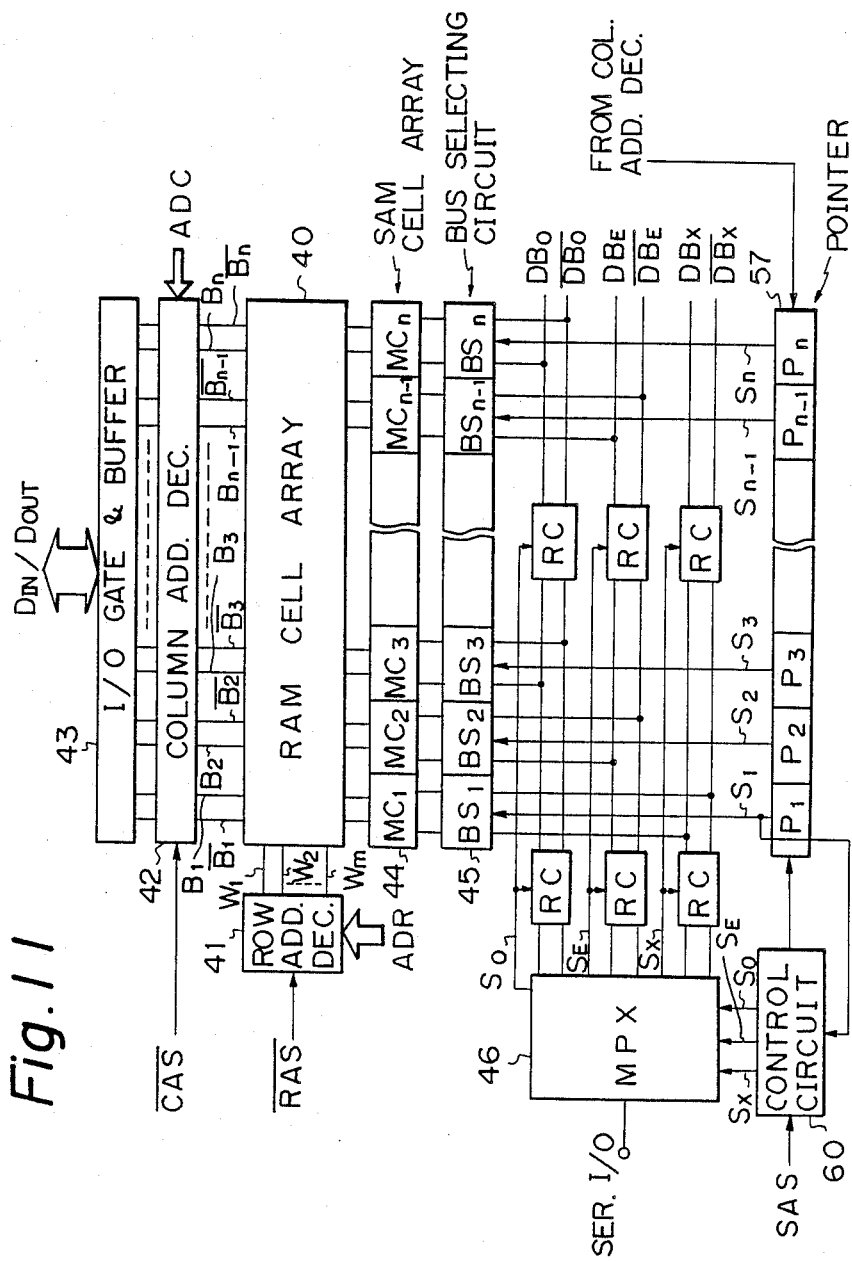
FIG. 11 is a circuit diagram illustrating a constitution of a modification of the embodiment shown in FIG. 4.

Although, in the described and illustrated embodiments, the bit data corresponding to the last address of the transfer data block is read on the third data bus $DB_X$, $\overline{DB_X}$, it is not restrictive. For example, as shown in FIG. 11 as a modification of FIG. 4, the third data bus may transfer the bit data corresponding to the head address of the transfer data block. In this case, the control circuit 60 outputs the control clock $S_X$ in response to the bus select signal $S_1$ from the pointer 57.

The important feature is that the device is constituted such that bit data of either of the head address or the last address between the transfer data blocks in sequence is read on the third data bus DB$_X$, $\overline{\text{DB}_X}$.

Figure 12B:
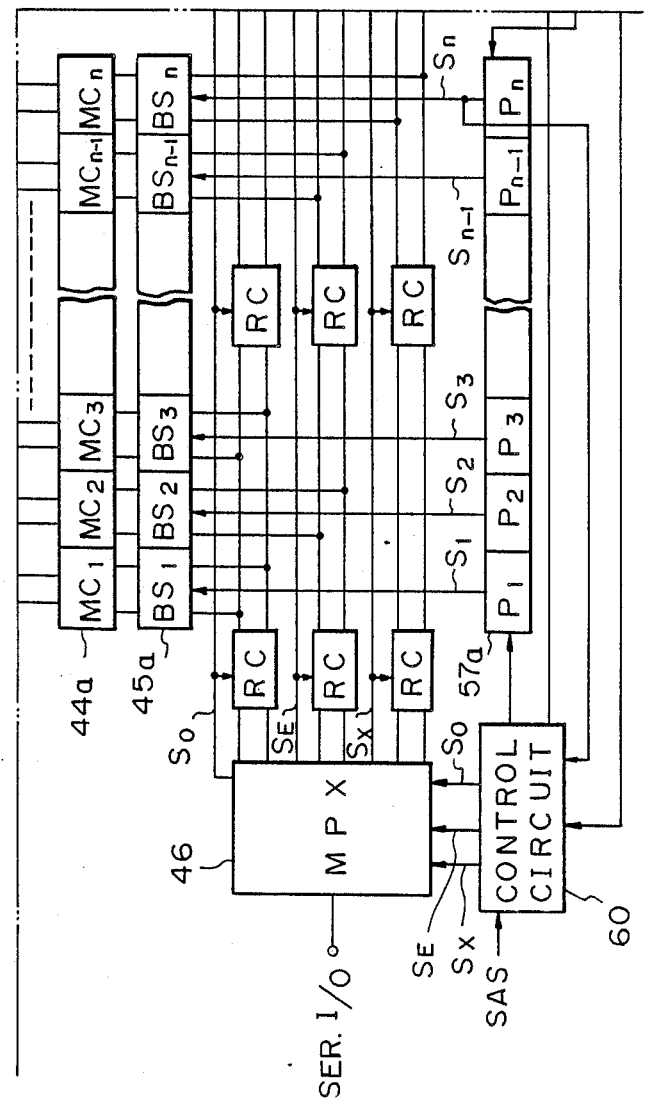
Figure 12C:
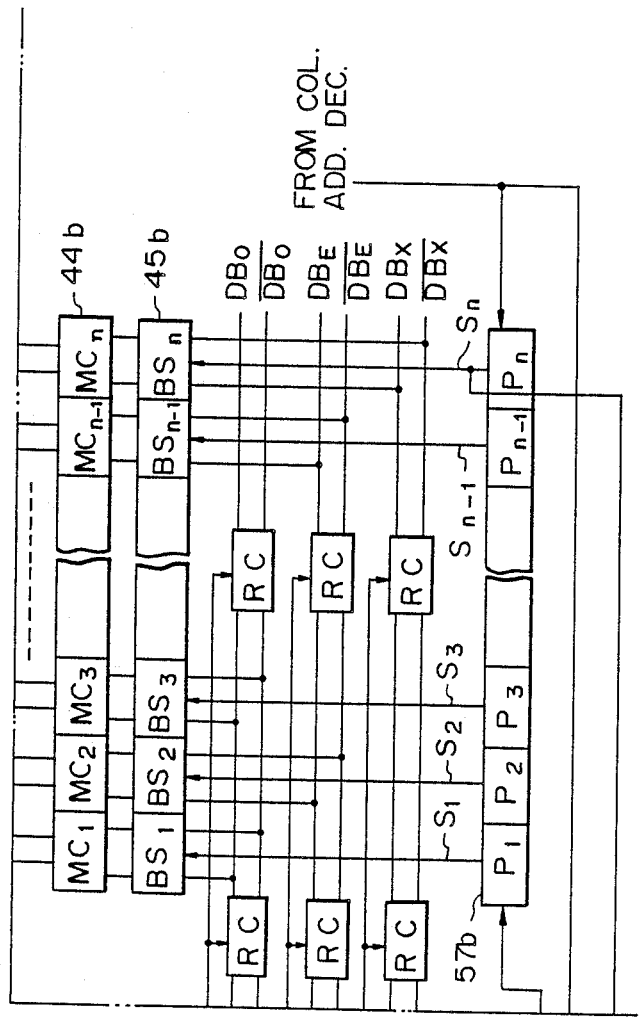

Also, as shown in FIGS. 12A, 12B and 12C as another modification of FIGS. 4A and 4B, the SAM cell array, the bus selecting circuit and the pointer may be constituted in a duplicated form. In this case, a multiplexer 59 is newly provided. The multiplexer 59 switches one of the SAM cell arrays 44a and 44b to the RAM cell array 40 in the transfer mode between the RAM and SAM. The SAM cell array 44a (44b) is associated with the bus selecting circuit 45a (45b) and the pointer 57a (57b).

According to the constitution of FIGS. 12A, 12B and 12C when the serial data transfer is carried out between the serial I/O terminal and the first SAM cell array 44a, the second SAM cell array 44b can be associated with the RAM cell array 40 via the multiplexer 59, and vice versa. Namely, when one of the SAM cell arrays participates in the serial data transfer, the other thereof can receive bit data from the RAM cell array and be prepared for the next participation in the data transfer. Thus, this contributes to a further increase in the speed of the serial data transfer.

Although the present invention has been disclosed and described by way of only two embodiments, it is apparent to those skilled in the art that other embodiments and modifications of the present invention are possible without departing from the spirit or essential features thereof.

I claim:

1. A semiconductor memory device comprising:
   a first memory cell array having a plurality of random access memory cells arrayed in a row direction and a column direction;
   a second memory cell array operatively connected to said first memory cell array and having at least serial access memory cells corresponding to a single row of said first memory cell array, said serial access memory cells having a first part corresponding to odd number addresses and a second part corresponding to even number addresses, one of said first and second parts including at least one specific serial access memory cell;
   a first data bus allocated to said first part;
   a second data bus allocated to said second part;
   a third data bus allocated to said at least one specific serial access memory cell; and
   a bus switching control circuit for controlling a connection of each of said serial access memory cells to one of the data buses and selecting one of the data buses to connect the selected data bus to an external terminal of said semiconductor memory device,
   said bus switching control circuit outputting each of bit data in said serial access memory cells serially and alternately to said first and second data buses, when a plurality of transfer data blocks are serially read out from said second memory cell array, outputting a bit data in said at least one specific serial access memory cell corresponding to a head or last address in each of said transfer data blocks to said third data bus.

2. A device as set forth in claim 1, wherein said bus switching control circuit comprises a pointer which determines said head address in said transfer data block and said last address therein, a serial access memory cell corresponding to said head address being connected to one of said first and second data buses and a serial access memory cell corresponding to said last address being connected to said third data bus.

3. A device as set forth in claim 2, wherein said last address in said transfer data block is fixed to the last address in said second memory cell array.

4. A device as set forth in claim 3, wherein said bus switching control circuit further comprises a control circuit which generates a first control clock for said first data bus and a second control clock for said second data bus alternately in response to a serial access strobe signal and generates a third control clock for said third data bus in response to a signal indicating said last address fed from said pointer, and a multiplexer which responds to one of said first, second and third control clocks and connects the corresponding data bus to the external of said device.

5. A device as set forth in claim 4, wherein said bus switching control circuit further comprises at least two reset circuits which short-circuit said first and second data buses to bring said data buses to reset states when a bit data is output from the serial access memory cell corresponding to said last address via said third data bus to the external of said device.

6. A device as set forth in claim 5 wherein said bus switching control circuit further comprises a bus selecting circuit connected between said second memory cell array and said data buses and having selecting circuits provided for each of said serial access memory cells, each of said selecting circuits connecting the corresponding serial access memory cell to one of said data buses in response to a corresponding bus select signal fed from said pointer.

7. A device as set forth in claim 6, comprising said second memory cell array, said pointer and said bus selecting circuit in two numbers, respectively, wherein said bus switching control circuit further comprises a second multiplexer connected between said first memory cell array and said two second memory cell arrays, said second multiplexer connecting one of said two second memory cell arrays to said first memory cell array.

8. A device as set forth in claim 1, wherein said bus switching control circuit comprises a pointer determining said head address in said transfer data block and a counter determining said last address therein, a serial access memory cell corresponding to said head address being connected to one of said first and second data buses and a serial access memory cell corresponding to said last address being connected to said third data bus.

9. A device as set forth in claim 8, wherein said last address in said transfer data block is selectable in accordance with a timing of application of an external control signal.

10. A device as set forth in claim 9, wherein said bus switching control circuit further comprises a control circuit which generates a first control clock for said first data bus and a second control clock for said second data bus alternately in response to a serial access strobe signal and generates a third control clock for said third data bus in response to said external control signal, and a multiplexer which responds to one of said first, second and third control clocks and connects the corresponding data bus to the external of said device.

11. A device as set forth in claim 10, wherein said bus switching control circuit further comprises at least two reset circuits which short-circuit said first and second data buses to bring said data buses to reset states when a bit data is output from the serial access memory cell corresponding to said last address via said third data bus to the external of said device.

12. A device as set forth in claim 11, wherein said bus switching control circuit further comprises a bus selecting circuit connected between said second memory cell array and said data buses and having selecting circuits provided for each of said serial access memory cells, each of said selecting circuits connecting the corresponding serial access memory cell to one of said data buses in response to a corresponding bus select signal fed from said pointer or a corresponding bus change signal fed from said counter.

13. A device as set forth in claim 1, wherein said bus switching control circuit comprises a pointer which determines said head address in said transfer data block and said last address therein, a serial access memory cell corresponding to said last address being connected to one of said first and second data buses and a serial access memory cell corresponding to said head address being connected to said third data bus.

14. A device as set forth in claim 13, wherein said head address in said transfer data block is fixed to the head address in said second memory cell array.

15. A device as set forth in claim 14, wherein said bus switching control circuit further comprises a control circuit which generates a first control clock for said first data bus and a second control clock for said second data bus alternately in response to a serial access strobe signal and generates a third control clock for said third data bus in response to a signal indicating said head address fed from said pointer, and a multiplexer which responds to one of said first, second and third control clocks and connects the corresponding data bus to the external of said device.

* * * * *